July 4, 1961 S. NAPOLIN 2,990,606

HIGH FREQUENCY CAPACITORS

Original Filed Oct. 27, 1954 2 Sheets-Sheet 1

INVENTOR.
SEYMOUR NAPOLIN

BY Theodore Hafner

ATTORNEY

INVENTOR.
SEYMOUR NAPOLIN
BY
Theodore Hafner
ATTORNEY

United States Patent Office 2,990,606

Patented July 4, 1961

2,990,606

HIGH FREQUENCY CAPACITORS

Seymour Napolin, Williston Park, N.Y., assignor to Granco Corporation, Long Island City, N.Y., a corporation of New York Original application Oct. 27, 1954, Ser. No. 465,117, now Patent No. 2,831,117, dated Apr. 15, 1958. Divided and this application Nov. 3, 1955, Ser. No. 544,796

1 Claim. (Cl. 29—25.41)

This invention is a division of U.S. Ser. No. 465,117, filed on October 27, 1954, now Patent No. 2,831,117 granted April 15, 1958, and relates to the manufacture of tuning devices especially those applicable to high frequency wave ranges such as broadcasting or telecasting reception and transmission.

One of the objects of the invention is to provide a high frequency tuning capacitor of extremely simple construction, inexpensive in manufacture and assembly, and facilitating ready incorporation in or connection to existing radio and television tuning devices.

Another object of the invention is a tuning capacitor comprising to a great extent stamped metal parts, and serving simultaneously as circuit elements as well as supports and connectors.

A more specific object of the invention is to support one or more preferably cylindrical condenser electrodes coaxially extending over an inductance plate, thereby forming a complete and very compact tuning circuit.

A further object of the invention is to support at least one adjustable tuning condenser on side flaps of a stamped metal plate forming an inductance element, with additional side flaps permitting connection of the tuning circuit thus constituted with other circuit elements of a radio or television receiver or any other desired circuitry.

Still another object of the invention is to support on a sheet metal plate representing an inductance element in an oscillator or mixer circuit, a tube socket and at least one adjustable condenser on one side thereof and which in turn is supported on the bottom side of a chassis panel with the tube socket facing with one side of its contact-making side the electrodes of the condenser, and facing with its other or tube receiving side an opening in the chassis through which the corresponding oscillator and/or mixer tube fitting this socket can be inserted so as to project therefrom in otherwise well known manner.

In this way the electrical connections between tuning device, tube and any other circuit element or elements are reduced to a minimum.

A more specific object of the invention is to provide a simple attachment mechanism between a tube cover and the opening in the chassis panel which supports the inductance plate attached to that chassis panel and forms a tuning device with at least one adjustable condenser supported over and on such inductance plate.

In this manner a tube socket can be supported on the inductance plate with one side facing the condenser electrodes and the other side facing the opening in the chassis panel.

Still another object of the invention is to support several adjustable condensers on side flaps of an inductance element formed of sheet metal and to support on the electrodes of the condenser shunting or shunt adjusting elements or plates whereby at least some of these supporting means also serve as conducting means thereby reducing electrical connections to a minimum and facilitating assembly of the tuning device as well as its mechanical and electrical incorporation in other apparatus or circuits.

These and other objects of the invention will be more fully understood from the drawings annexed herewith in which FIGS. 1 and 2 in top and rear views respectively represent a tuning device showing an adjustable condenser incorporating certain features of the invention.

Figure 1:
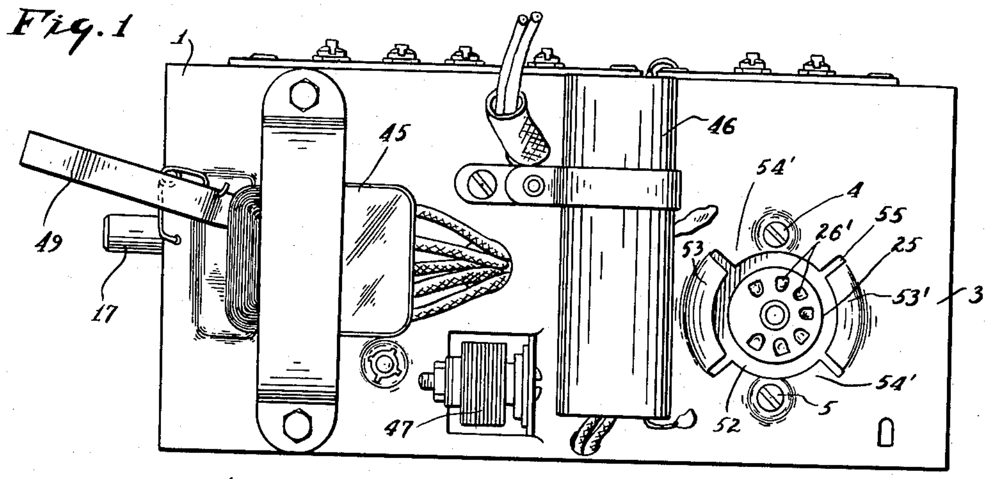
Figures 2, 3:
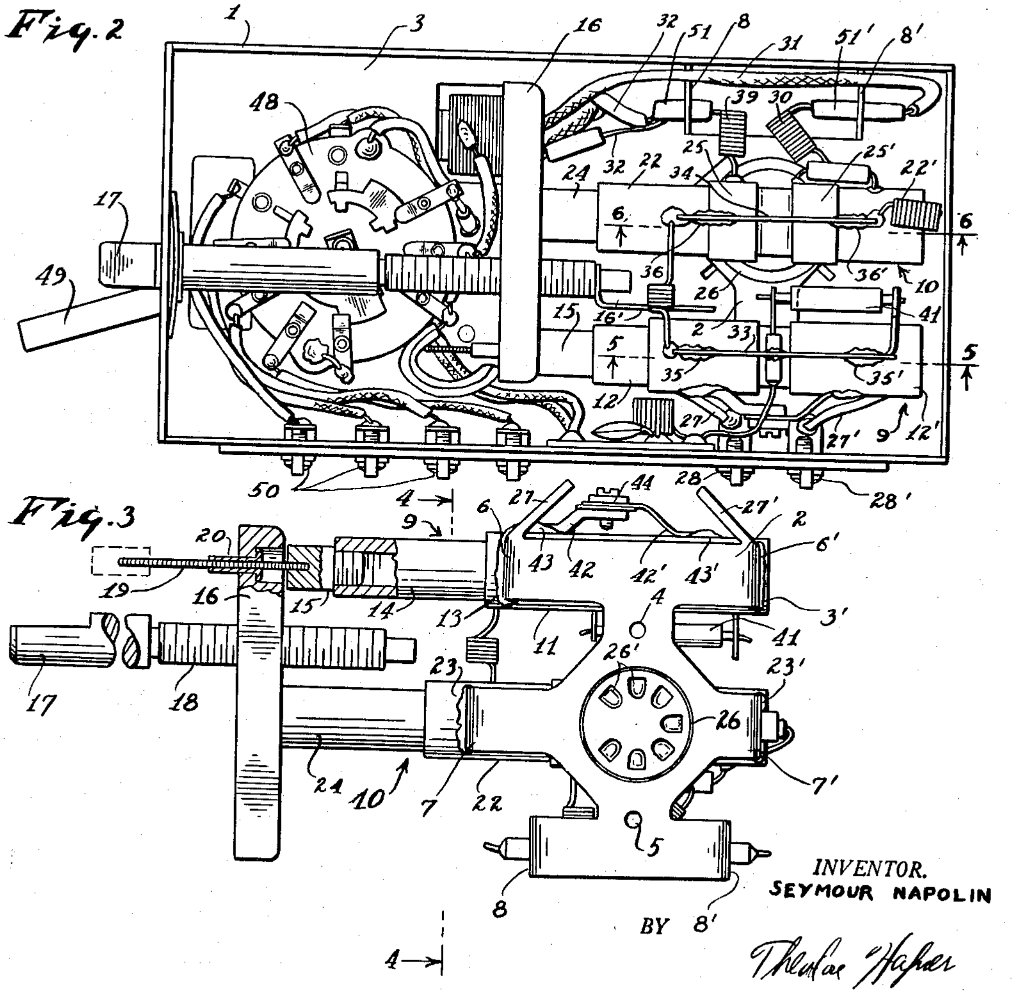
FIG. 3 represents in greater detail an adjustable condenser with part of it in section.

In FIGS. 1 and 2 a high frequency tuning circuit or device used for a television or frequency modulation radio receiver, is shown to be supported on a chassis 1 by means of its inductance element which is in the form of a stamped sheet metal plate 2 attached to chassis panel 3 by screws 4 and 5 respectively. Inductance plate 2 has the shape more closely indicated in FIG. 3 and is provided with pairs of perpendicular side flaps more closely indicated in FIG. 4 at 6, 6', 7, 7', and 8, 8', respectively.

Side flaps 6, 6' and 7, 7' serve simultaneously to connect electrically and support mechanically a pair of adjustable condensers 9 and 10 respectively, which form together with inductance plate 2 a combined mixer and tuner circuit for example with condenser 9 representing an antenna-mixer condenser and condenser 10 representing oscillator-tuning condenser. Each of condensers 9, 10 is of otherwise well known and similar construction, except that a condenser 9 in addition to being adjustable simultaneously with condenser 10 is shorter in length and also additionally adjustable, substantially independently from condenser 10 as will be explained further below.

Condenser 9 consists of an insulating tube made of borosilicate glass or the like indicated at 11 and supporting at its outside a pair of cylindrical electrodes applied in any known manner or preferably in a manner representing another feature of the invention as will be explained further below.

The two electrodes of condenser 9 are indicated in FIG. 2 at 12, 12' respectively and they are connected at and supported on their circumferences and their outer ends respectively by perpendicular side flaps 6, 6', respectively, of inductance plate 2.

Figure 4:
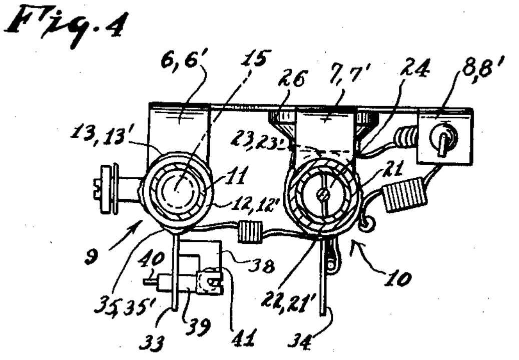
FIG. 4 represents a cross-section of FIG. 3 along lines 4—4.

These connections which represent electrical as well as mechanical connections are indicated in FIGS. 3 and 4 by solder points 13, 13', respectively.

Adjustment of condenser 9 is caused to occur by means of a metallic or metallized plunger or plunger tube 14, supported on an insulating tube 15 which in turn is mounted on an adjustment bracket 16.

Adjustment bracket 16 in turn is held through a threaded opening (not shown) on adjustment bolt 17 provided with a threaded portion 18 fitting into the corresponding opening (not shown) of adjustment bracket 16.

Adjustment bolt 17 is rotatably supported near one end on the front portion of chassis 1 as schematically indicated in FIGS. 1 and 2 and by its rotation will cause movement of adjustment bracket 16 in axial direction. The other end is rotatedly supported on a triangular plate 16, also diagrammatically indicated in FIG. 7, attached to chassis 1.

Front and back mountings and shaft structure are designed for temperature correction, allowing expansion of shaft 17 to compensate for expansion of steel thereby avoiding or reducing frequency drift.

In this way condensers 9 and 10 having plungers supported on adjustment bracket 16 can be adjusted in their capacity.

More specifically, as already stated above, condenser 9 will be adjusted by the axial movement of plunger 14 with respect to its electrodes 12, 12'.

In addition to the movement of plunger 14 under control of adjustment bracket 16, plunger tube 14 is additionally adjustable with respect to its suporting insulating tube in the following manner:

Plunger tube 14 is attached to an axial screw bolt 19 which is rotatably supported in a metal sleeve acting as a nut member 20 mounted on adjustment bracket 16. By rotating screw bolt 19 in one or the other direction while holding plunger tube 14, plunger tube 14 attached thereto will be forced to move axially over screw bolt 19 in one or the other direction thereby causing plunger tube 14 slidingly to move over its supporting insulating tube 15 in the one or the other direction. In this way the axial position of plunger tube 14 with respect to bracket 16 and thereby the zero or rest position of plunger tube 14 with respect to electrodes 12, 12′ is adjusted.

Condenser 10 is substantially similar in construction although different in dimension and support from condenser 9.

Condenser 10 is also shown to consist of an insulating tube of Nonex glass indicated at 21 and provided with a pair of cylindrical electrodes applied in a manner similar to that indicated for condenser 9 and designated at 22, 22′ respectively.

Condenser 10 is supported on side flaps 7, 7′ which are electrically as well as mechanically conected to electrodes 22, 22′ respectively by means of solder points indicated in FIGS. 3 and 4 at 23, 23′ respectively.

Adjustment of condenser 10 is caused to occur by means of a plunger 24 axially adjustable with one end within condenser tube 21 and fixedly supported at its other end on adjustment bracket 16.

In accordance with another feature of the invention one of the plungers of condensers 9, 10 is arranged to slide in its associated condenser tube 11, 21 respectively as the case may be with a lesser degree of tolerance than in the other of condenser tubes 11, 21.

In this particular case, plunger 24 which is not adjustable with respect to adjustment bracket 16, is arranged to slide in condenser tube 21 with a very close tolerance amounting to substantial physical contact with the inner surface of condenser tube 21.

On the other hand plunger 14 is arranged to slide in its associated condenser tube 11 with a greater amount of tolerance or substantially out of physical contact with the inner surface of condenser tube 11.

In this way the two condensers 9, 10 can be made adjustable substantially simultaneously as well as independently; more specifically condenser 9 can be additionally adjusted axially and substantially independently from condenser 10.

In addition to side flaps 6, 6′ and 7, 7′ providing mechanical support and electrical connection for condensers 9 and 10 respectively, in accordance with another feature of the invention there are provided further side flaps projecting from other portions of inductance plate 2 and forming electrical connections as well as supporting elements if necessary for other elements of the circuitry to which the tuning device in accordance with this invention is to be connected, as disclosed in the above mentioned copending application.

In addition to connecting the outer ends of electrodes 22, 22′ to supporting flaps 7, 7′, the inner ends of electrodes 22, 22′ are connected through rings 25, 25′ respectively to contacts of a tube socket 26 supported on inductance plate 2 so that at one side of inductance plate 2 the contacts of socket 25 will project while on the opposite side of socket 25 the receiving openings for the tube pins will be apparent as schematically indicated for example in FIG. 3 at 26′.

In this way, connections between condenser electrodes and other circuit elements for example the electrode of an oscillator and/or mixer tube supported on socket 26 are held to a minimum.

Figure 6:
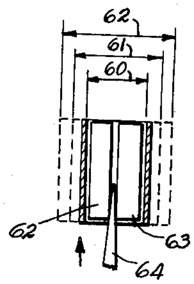
FIG. 6 illustrates a preferred method of manufacture.
Figure 5:
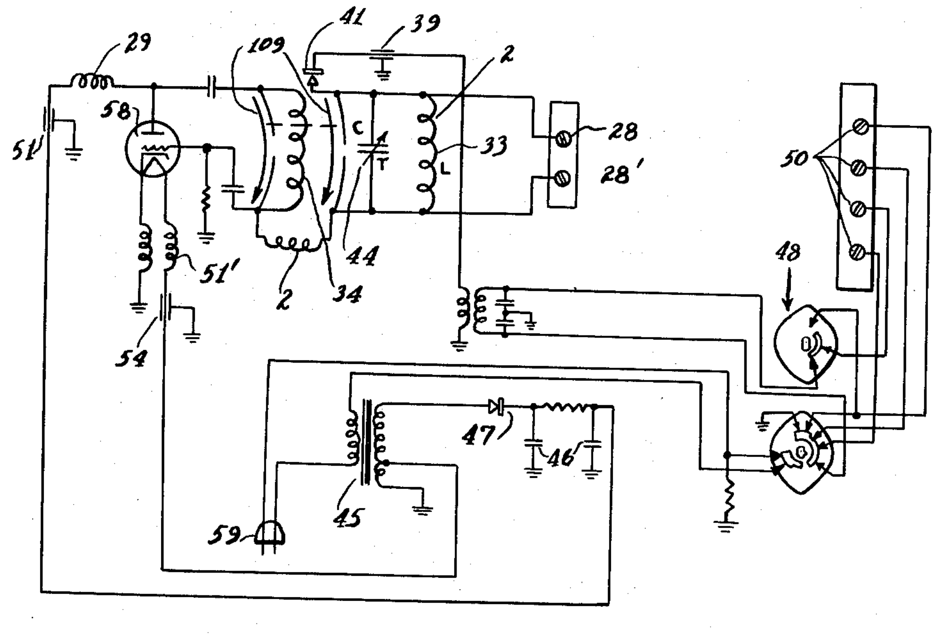
FIG. 5 shows a circuit diagram of a tuning circuit such as illustrated in FIGS. 1 through 4.

Shunting plates of this type are indicated in FIG. 4 at 33, 34 respectively with side views being shown in FIGS. 5 and 6 respectively on an enlarged scale.

One of these shunt plates shown in FIG. 4 at 33 and in FIG. 5 on an enlarged scale, consists of a substantially quadrangular metal stamping of approximately U shape with the ends of the U being connected to and supported on electrodes 11, 11′ of condenser 9 by means of solder points schematically indicated in FIGS. 2 and 4 at 35, 35′ respectively.

The shunting effect of shunting plate 33 can be adjusted by providing inside its U-shaped form a central flap 36 of approximately triangular or trapezoidal shape which is also stamped out of one piece with shunting plate 33 and the position of which can be adjusted by bending flap 36 inwardly or outwardly out of the plane of shunting plate 33.

In a similar form to that of shunting plate 33, and in a similar manner, shunting plate 34 is electrically and mechanically connected to and supported on electrodes 21, 21′ by means of solder points indicated in FIGS. 2 and 4 at 37, 37′ respectively.

If necessary, a further adjustment of the shunting effect of at least one of shunting plates 33, 34 can be realized in the manner as for example indicated on shunting plate 33 by providing a further flap 38 projecting perpendicular to the plane of shunting plate 33.

At the same time shunting plates 33, 34 can be used to support circuit elements in an apropriate manner with or without the provision of additional flaps, all this without exceeding the scope of the invention.

For example in the embodiment of the invention shown in FIGS. 1 through 4 shunting plate 33 is provided with an inner connection for connecting shunting plate 33 to elements of the circuitry if necessary.

Furthermore in the embodiment of the invention shown, this inner connection of shunting plate 33 is formed as a lead-through condenser 39 of otherwise well known construction which is arranged in accordance with the requirements of the circuits concerned in an off-center position with respect to shunting plate 33.

Between the lead-through electrode or wire 40 of condenser 39 and perpendicular flap 38 of shunting plate 33 there is arranged supported on and connected to lead 40 and flap 38 a crystal diode indicated in FIGS. 2 to 4, and at 41.

In a further embodiment of the invention a further shunting or shorting element is provided on at least one of condensers 9, 10 in the form of an adjustable trimming condenser 44 suported on conducting but capacity reducing flaps 42, 42′ connected respectively to electrodes 11, 11′ by means of solder points 43, 43′ respectively.

Trimmer condenser 44 is of otherwise well known construction and adjustable in known maner.

The invention is not limited to the form or arrangement of flaps and connecting elements illustrated and described, but may be applied in any form or manner whatsoever without departing from the scope of this invention.

Other circuit elements and/or connections are supported in well known manner on the bottom and top sides respectively of chassis 1 such as transformer 45, electrolytic filter condenser 46, rectifier stack 47 which are arranged on top of chassis 1, while the bottom of chassis 1 or its top panel supports a multiposition switch 48 operated by a lever 49.

Additional connection terminals are provided on the side of chassis 1 at 50 and the bottom of chassis 1 may be covered up in otherwise well known manner with an appropriate cover plate, not shown.

As stated before, condensers 9, 10 can be manufactured in well known manner without departing from the scope of this disclosure.

However, in accordance with this invention and in a manner particularly useful for the purpose of this invention, especially for the simultaneous realization of electrical connection and mechanical support of adjustable condensers on side flaps of an inductance plate, the cylindrical condenser electrodes 11, 11' and 21, 21' are produced, instead of by coating or in any other known manner, by fitting over the supporting insulator tube, pairs of metallic sleeves with rather thin walls on the order of .30 inch.

In this way the manufacture of condensers is extremely simplified while at the same time electrodes are realized which are relatively strong and permit direct attachment by soldering or otherwise of connecting elements such as side flaps of an inductance plate, in the manner shown in FIGS. 1 through 6 in accordance with certain principles of this invention.

In a specific embodiment of the invention, electrodes such as shown at 11, 11' and 21, 21' in the form of thin walled cylindrical sleeves are slipped over the supporting tube by first heating the cylindrical sleeves thereby expanding their diameter and then, while they are hot, slipping the sleeve over opposite ends respectively of the supporting tube, i.e. a Nonex tube. After cooling the Nonex tube down secure adherence of the electrodes on the associated supporting tube is achieved.

In addition to preheating the cylindrical sleeves as stated above, such sleeves can be pre-expanded or stretched before being slipped over an expanding tool consisting of two or more cylindrical sectors. Before or at the same time or immediately thereafter the sleeves are heated to keep them expanded for a predetermined time and during that time and while they remain expanded, they are slipped over the mounting tube.

It is also feasible although not as practical as previously provided to provide merely an expansion of the cylindrical sleeves and to insert the mounting tube into these sleeves while these sleeves are being expanded. However such an arrangement requires special mounting machinery.

In accordance with a preferred embodiment of the invention, as illustrated for example schematically in FIG. 6 an electrode sleeve is first mechanically expanded from a diameter 60 which is smaller than diameter 61 of the supporting glass tube, to approximately that diameter 61, and thereafter it is further expanded by being heated to a diameter 62 which is larger than diameter 61, i.e. sufficiently large to be slipped over while hot, over diameter 61.

Mechanical expansion is caused in otherwise well known manner, for example by a gradual increase of the space between several (three or more) expansion members or fingers 62, 63, etc., cooperating with an upwardly moving conical expansion member 64.

This method of mechanical expansion has the advantage that together with the expansion, burrs on the electrode sleeves are eliminated and a more perfect adherence of the electrode to the glass surface is effected.

Expansion heating is also caused in otherwise well known manner in a heating oven or by electronic heating and it should occur immediately or as soon as possible after mechanical expansion, say within three hours after mechanical expansion, but at least on the same working day on which mechanical expansion has taken place.

Thus not only the elastic force due to thermal contraction following heating, but also the elastic force due to mechanical contraction following mechanical expansion, contributes to cause firm adherence of the electrodes to the supporting glass tube under all possible temperature and other operating conditions.

In the circuit diagram of FIG. 5, the elements shown in FIGS. 1 to 6 are indicated in substantially the same manner as in FIGS. 1 to 6.

More specifically the two adjustable condensers with capacity C are indicated at 9, 10. The common inductance plate is indicated at 2. The trimming condenser having an inductance C is indicated at 44.

The shunting inductances are indicated at 33, 34 respectively. Lead through condenser and crystal diode are indicated at 39, 41, respectively. The tube supported on socket 25 is indicated at 58 while transformer 45 connects the line plug 59 over rectifier 47, filter 46, tube 58 and the oscillation, IRF amplifier and mixer circuit on one side of terminals 28, 28' on the other side over two-deck switch 48 to terminals 50. Plate and cathode chokes are indicated at 29, 30 connected to lead through condensers 59, 59' respectively supported on flaps 8, 8' respectively.

While the invention has been described in connection with an inductance plate supporting several adjustable condensers, it can be applied without departing from the scope of this disclosure to an inductance plate supporting only one adjustable condenser or supporting more than two adjustable condensers.

Nor is the invention limited to shape, form, type and arrangement of condenser, inductance or any other circuit element as described and illustrated, but it may be applied in any form whatsoever without departing from the scope of this invention.

I claim:

In a method for the manufacture of a tubular condenser having cylindrical electrodes supported coaxially and in juxtaposition outside of said insulating tube and a conducting plunger extending through the inside of said tube, the steps of manufacturing electrodes and insulating tube as separate open ended tubular units, said electrodes being in the form of conducting open ended metal cylinders; stretching said cylinders mechanically within the limit of elastic deformation to a diameter approximately corresponding to the diameter of said insulating tube, further expanding said cylinders while being stretched by heating, and slipping said stretched and heated cylinders over opposite ends of said insulating tube to obtain substantially uniform adherence to the outer surface of said insulating tube; and attaching to a circumferential portion of each of said conducting cylinders means forming an electrical connection as well as a mechanical haltering for the condenser.

References Cited in the file of this patent

UNITED STATES PATENTS

| | | |
|---|---|---|
| 1,057,159 | Madsen | Mar. 25, 1913 |
| 1,727,755 | Dickinson | Sept. 10, 1929 |
| 2,253,026 | Godsey | Aug. 19, 1941 |
| 2,412,271 | Kercher | Dec. 10, 1946 |
| 2,667,581 | Auerbacker et al. | Jan. 26, 1954 |
| 2,677,769 | Fathauer | May 4, 1954 |